(12) United States Patent
Alie et al.

(10) Patent No.: US 7,034,393 B2
(45) Date of Patent: Apr. 25, 2006

(54) SEMICONDUCTOR ASSEMBLY WITH CONDUCTIVE RIM AND METHOD OF PRODUCING THE SAME

(75) Inventors: Susan A. Alie, Stoneham, MA (US); Bruce K. Wachtmann, Concord, MA (US); Michael Judy, Wakefield, MA (US); David Kneedler, Middleton, MA (US)

(73) Assignee: Analog Devices, Inc., Norwood, MA (US)

( * ) Notice: Subject to any disclaimer, the term of this patent is extended or adjusted under 35 U.S.C. 154(b) by 4 days.

(21) Appl. No.: 10/737,231

(22) Filed: Dec. 15, 2003

(65) Prior Publication Data

US 2005/0127525 A1    Jun. 16, 2005

(51) Int. Cl.
*H01L 23/02* (2006.01)
*H01L 23/10* (2006.01)
*H01L 23/12* (2006.01)

(52) U.S. Cl. .................. 257/704; 257/723; 257/777; 257/710; 257/924

(58) Field of Classification Search ................ 257/704, 257/209, 528, 529, 665, 723, 678, 777, 685, 257/686, 710, 924, E23.123; 438/132, 215, 438/281, 333, 467, 601
See application file for complete search history.

(56) References Cited

U.S. PATENT DOCUMENTS

| | | | | |
|---|---|---|---|---|
| 5,229,647 A | * | 7/1993 | Gnadinger | 257/785 |
| 5,355,022 A | | 10/1994 | Sugahara et al. | 257/768 |
| 5,545,912 A | | 8/1996 | Ristic et al. | 257/417 |
| 5,929,497 A | | 7/1999 | Chavan et al. | 257/417 |
| 5,939,633 A | | 8/1999 | Judy | 73/514.32 |
| 6,118,181 A | | 9/2000 | Merchant et al. | 257/757 |
| 6,236,115 B1 | * | 5/2001 | Gaynes et al. | 257/774 |
| 6,239,495 B1 | * | 5/2001 | Sakui et al. | 257/777 |
| 6,323,550 B1 | | 11/2001 | Martin et al. | 257/704 |
| 6,448,109 B1 | | 9/2002 | Karpman | 438/108 |
| 6,505,511 B1 | | 1/2003 | Geen | 73/504.12 |
| 6,744,127 B1 | * | 6/2004 | Hedler et al. | 257/686 |
| 2004/0232500 A1 | * | 11/2004 | Rudhard et al. | 257/414 |

FOREIGN PATENT DOCUMENTS

| | | | |
|---|---|---|---|
| EP | 1219565 A1 | * | 3/2002 |
| EP | 1219565 A1 | | 7/2002 |
| EP | 1296374 A1 | | 3/2003 |
| WO | WO 01/56921 A2 | | 8/2001 |
| WO | WO 02/093122 A2 | | 11/2002 |

OTHER PUBLICATIONS

Authorized Officer Katrin Sommermeyer, *International Search Report*, International Searching Authority, Mar. 14, 2005, 7 pages.

Chavan et al., *A Monolithic Fully-Integrated Vacuum-Sealed CMOS Pressure Sensor*, 2000 IEEE, Document No. 0-7803-5273-4/00, 341-346, 6 pages.

Wolffenbuttel, *Low-temperature intermediate Au-Si wafer bonding; eutectic or silicide bond*, Sensors and Actuators A 62, 1997, 680-686, 7 pages.

* cited by examiner

*Primary Examiner*—Jasmine Clark
(74) *Attorney, Agent, or Firm*—Bromberg & Sunstein LLP (57) ABSTRACT

An apparatus has first and second wafers, and a conductive rim between the first and second wafers. The conductive rim electrically and mechanically connects the first and second wafers. In addition, the conductive rim and second wafer at least in part seal an area on the surface of the first wafer.

18 Claims, 6 Drawing Sheets

FIG. 6 ated more fully from the following further description thereof with reference to the accompanying drawings wherein:

SEMICONDUCTOR ASSEMBLY WITH CONDUCTIVE RIM AND METHOD OF PRODUCING THE SAME

FIELD OF THE INVENTION

The invention generally relates to electronic devices and, more particularly, the invention relates to capped electronic devices.

BACKGROUND OF THE INVENTION

Microelectromechanical systems (i.e., "MEMS") are highly miniaturized devices that can be configured to perform a wide variety of functions. For example, a MEMS device can be implemented as an accelerometer to measure the acceleration of a moving body. One type of MEMS accelerometer, for example, has a suspended mass that, in response to an acceleration, moves relative to an underlying substrate. Acceleration thus may be calculated as a function of the movement of the suspended mass relative to its underlying substrate.

Because of their relatively small size, the mechanical structures of MEMS devices (e.g., the suspended mass in the above noted accelerometer) typically are both fragile and sensitive. Accordingly, many seemingly innocuous things can adversely impact MEMS performance, such as dust, moisture, and static electricity. The art has responded to this problem by isolating sensitive MEMS mechanical structures from the outside environment. For example, one isolation method bonds a cap over the mechanical components.

Although generally satisfactory for isolating MEMS structure, this solution creates other problems. In particular, the cap can accumulate a relatively large static electric charge that can adversely affect device performance and/or damage the MEMS device.

SUMMARY OF THE INVENTION

In accordance with one aspect of the invention, an apparatus has first and second wafers, and a conductive rim between the first and second wafers. The conductive rim electrically and mechanically connects the first and second wafers. In addition, the conductive rim and second wafer at least in part seal an area on the surface of the first wafer.

In some embodiments, the conductive rim and second wafer hermetically seal the area on the surface of the first wafer. Among other things, the conductive rim can be a silicide.

The sealed area on the first wafer may include a number of things, such as MEMS structure. In that case, the conductive rim illustratively is electrically isolated from the MEMS structure. Moreover, the second wafer may include a cap, which may in part protect the MEMS structure from the environment.

In some embodiments, the first wafer includes circuitry capable of delivering a bias voltage to the second wafer via the conductive rim. The circuitry may have a maximum temperature to which it can be exposed. In such case, the conductive rim illustratively is produced from a material that interdiffuses and/or melts at a temperature that is less than the maximum temperature to which the circuitry can be exposed.

At least one of the first wafer and the second wafer may be produced from a silicon based material. For example, at least one of the first wafer and the second wafer may be comprised of polysilicon, single crystal silicon, or silicon germanium.

In accordance with another aspect of the invention, a method of forming a MEMS device places rim material between a first wafer and a second wafer to form an intermediate apparatus. The rim material is placed so that it forms a closed loop defining an area on the first wafer. The method then both heats and applies pressure to the intermediate apparatus. After heating and applying pressure, the rim material cooperates with the first and second wafers to both seal the area on the first wafer and electrically connect the first and second wafers.

In illustrative embodiments, the second wafer is substantially parallel with the first wafer. The rim material may cooperate with the first and second wafers by integrating with the first and second wafers to form a composite material that comprises the rim material. For example, the rim material may diffuse into the first and second wafers to form a silicide material.

The method may form MEMS structure within the area on the first wafer. Circuitry also may be formed on the first wafer. Among other things, the circuitry may be capable of applying a bias voltage to the second wafer through the rim material.

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

In illustrative embodiments, a MEMS device has a conductive rim that secures a cap to a MEMS die. The conductive rim both seals MEMS structure on the MEMS die and electrically connects the cap with ground or a fixed bias potential. Among other things, the conductive rim may be formed at least in part from a silicide that integrally couples the cap and MEMS die. Details of various embodiments are discussed below.

Figure 1:
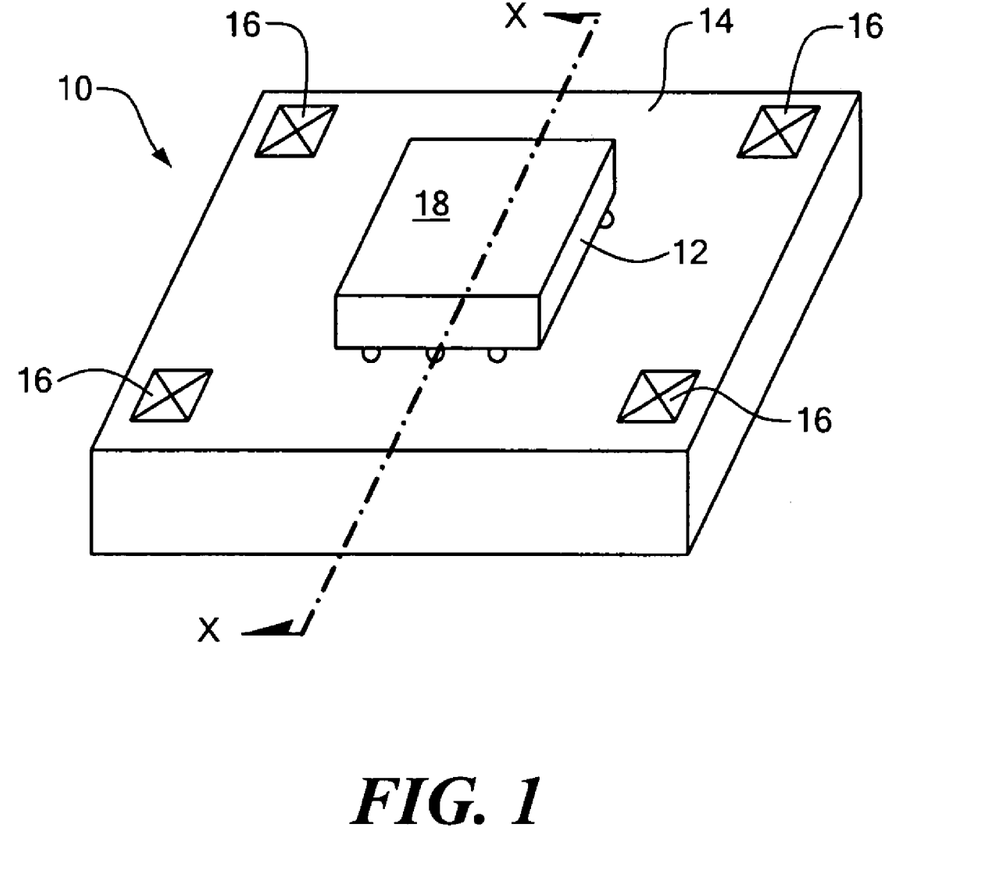
FIG. 1 schematically shows a perspective view of an electronic device that may be capped in accordance with illustrative embodiments of the invention.

FIG. 1 schematically shows a generic MEMS device 10 that may be configured in accordance with illustrative embodiments of the invention. The MEMS device 10 shown includes a capped MEMS die 12 coupled with a circuit die 14. Accordingly, the MEMS die 12 shown has structure that is controlled and/or monitored by circuitry on the circuit die 14. The circuit die 14 has bond pads 16 or other interconnects to electrically communicate with an external device, such as a computer. To further protect the MEMS device 10 from the environment, conventional processes may mount the entire MEMS device 10 within a package.

The MEMS device 10 may be any conventionally known MEMS device 10, such as an inertial sensor. For example, the MEMS device 10 may be a gyroscope or an accelerometer. Exemplary MEMS gyroscopes are discussed in greater detail in U.S. Pat. No. 6,505,511, which is assigned to Analog Devices, Inc. of Norwood, Mass. Exemplary MEMS accelerometers are discussed in greater detail in U.S. Pat. No. 5,939,633, which also is assigned to Analog Devices, Inc. of Norwood, Mass. The disclosures of U.S. Pat. Nos. 5,939,633 and 6,505,511 are incorporated herein, in their entireties, by reference.

Figure 2:
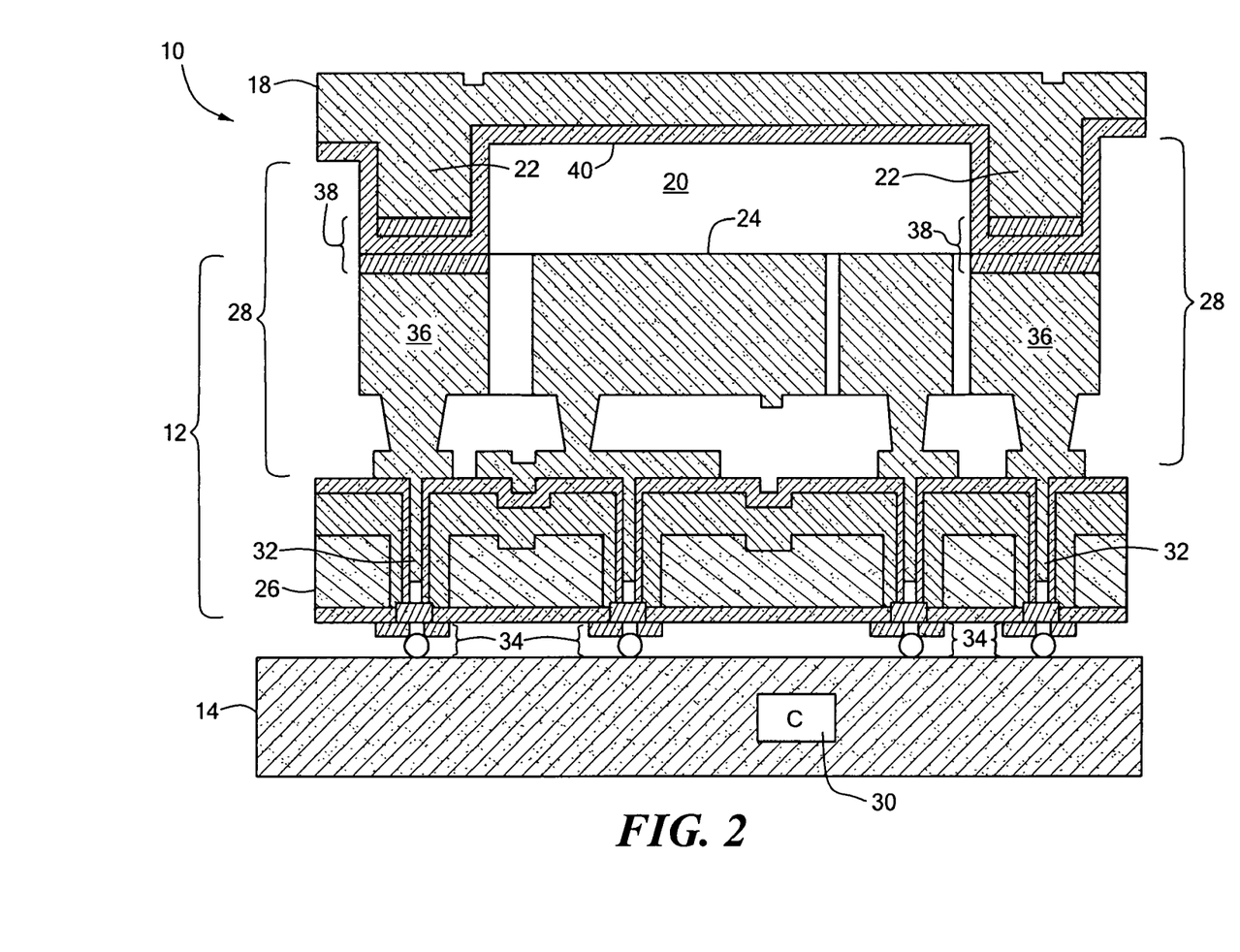
FIG. 2 schematically shows a cross-sectional view of the device shown in FIG. 1 along line X—X, where the device is configured in accordance with one embodiment of the invention.

FIG. 2 schematically shows a cross-sectional view of the device shown in FIG. 1 along line X—X. Specifically, the MEMS device 10 includes the above noted MEMS die 12 (e.g., comprised of a silicon-based material, such as silicon) having a silicon-based cap 18 mounted to its top side, and the above noted circuit die 14 mounted to its bottom side. The cap 18 illustratively is formed from polysilicon and etched to have a cavity 20 defined by a cap rim 22 extending from its interior side. The cavity 20 overlies a central portion of the MEMS die 12, which includes the primary structure 24 for effectuating the MEMS functionality. For example, if the MEMS die 12 is an accelerometer, the structure 24 may include a movable mass suspended above a substrate 26.

In accordance with illustrative embodiments, the MEMS device 10 is considered to form a conductive rim 28 that circumscribes the MEMS structure 24 on the MEMS die 12. Among other things, the conductive rim 28 forms a hermetic seal that protects the MEMS structure 24 from the environment. For example, the hermetic seal may protect the structure 24 from dust, moisture, and dirt. In alternative embodiments, the conductive rim 28 provides a non-hermetic seal to the MEMS structure 24. As known by those in the art, a non-hermetic seal may protect the MEMS structure 24 from dust and dirt, but it is not moisture impervious.

In addition to sealing the MEMS structure 24, the conductive rim 28 also electrically connects the cap 18 with the circuit die 14 through the MEMS die 12. The MEMS die 12 thus includes vias 32 and contacts 34 (e.g., balls of a ball grid array) that extend from the conductive rim 28, through the MEMS die 12, and to the circuit die 14. Circuitry 30 on the circuit die 14 sets the potential of the cap 18 to ground or any desired voltage level.

To those ends, the MEMS die 12 has a rim of polysilicon material (extending from the substrate 26 and referred to herein as the "MEMS rim 36") that integrally couples with the cap rim 22 extending from the cap 18. In illustrative embodiments, the cap rim 22 and MEMS rim 36 meet at a loosely defined intersection region 38 having a relatively high silicide concentration (discussed below with regard to FIG. 3). The concentration of silicide may be highest at the center of that intersection region 38 and reduce to essentially zero at its loosely defined ends. Moreover, the conductive rim 28 (formed from the intersection region 38, MEMS rim 36 and cap rim 22) preferably is electrically isolated from the MEMS structure 24 to ensure that the potential applied to the cap 18 is carefully controlled.

In illustrative embodiments, the MEMS rim 36 also acts as a sensor element. Alternatively, among other things, the MEMS rim 36 may act as a ground plane element, a circuit element, or dummy mechanical structure.

Figure 3:
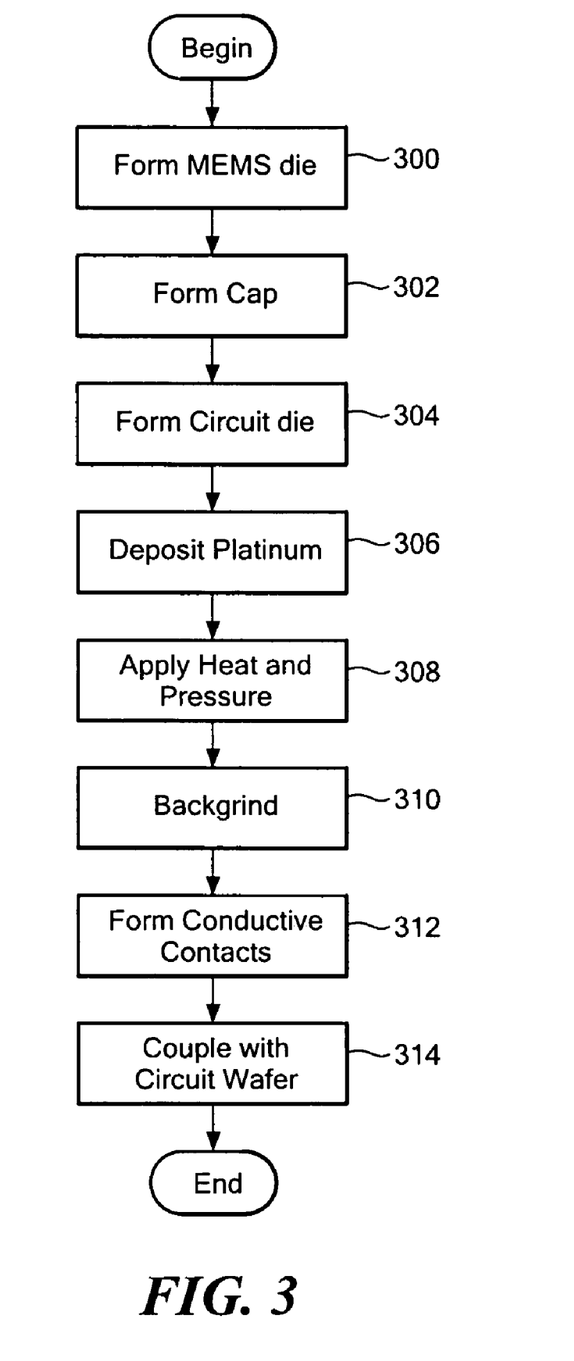
FIG. 3 shows a process of forming the electronic device shown in FIG. 2 in accordance with various embodiments of the invention.

FIG. 3 schematically shows an illustrative process of forming the MEMS device 10 shown in FIG. 2. It should be noted that various steps of this process may be performed in a different order than that discussed. In addition, those skilled in the art should understand that additional steps may be performed, while others may be omitted.

The process begins at step 300, in which the MEMS die 12 is formed in accordance with conventional processes. Among other processes, conventional surface micromachining processes may be used to form the MEMS die 12. Alternatively, silicon-on-insulator ("SOI") processes may be used. As noted above, the die may be formed from a silicon-based material, such as polysilicon. In alternative embodiments, however, other types of materials may be used. For example, single crystal silicon or silicon germanium may be used for all or selected portions of the MEMS die 12. In any case, the conductivity of the MEMS rim 36 should be controlled to be a satisfactory level. If necessary, some doping may be required to ensure appropriate conductive properties.

The cap 18 then is formed at step 302. In a manner similar to the MEMS die 12, the cap 18 may be formed from a polysilicon wafer (or other material) in accordance with conventional processes (e.g., surface micromachining processes). The sizes of the cavity 20 and cap rim 22 illustratively are selected to ensure a sufficient clearance with the MEMS die 12. In particular, the cavity 20 should be sufficiently large enough to not interfere with movement of the structure 24 on the MEMS die 12.

The process then continues to step 304, in which conventional processes form the circuit die 14. Any conventional circuitry designed to perform the desired function can be used. For example, the circuitry shown in the above noted incorporated patents can be used. In particular, if the MEMS device 10 is an accelerometer, then the circuitry shown in U.S. Pat. No. 5,939,633 can be used to sense electrostatic changes in the MEMS die 12. It should be noted that in illustrative embodiments, the MEMS die 12, cap 18 and circuit die 14 each are formed as one of an array of identical elements on a single wafer.

Conventional processes then may metalize the bottom side of the cap 18 (step 306). For example, a layer of platinum 40 may be sputter deposited onto the bottom side of the cap 18. The metalized cap 18 then may be placed on the MEMS die 12 so that the MEMS rim 36 directly contacts the cap rim 22.

At this point in the process, the MEMS die 12 and cap 18 are not secured together. Accordingly, to fuse them together, this intermediate apparatus is subjected to relatively high temperatures and pressures (at step 308) sufficient to form a silicide bond in the intersection region 38. Those skilled in the art should be able to select the appropriate temperatures and pressures. By way of example only, subjecting the intermediate apparatus to temperatures of between about 280–450 degrees C. and pressures of about two atmospheres for about forty to fifty minutes should provide satisfactory results.

This step in the process thus produces platinum-silicide in the intersection region 38. As known by those in the art, because of the inter-diffusion of the platinum into the polysilicon, the outer portions of the two rims and the platinum between the two rims cooperate to form a substantially integral and conductive connector. The concentration of platinum thus is highest in the center of the intersection region 38 (e.g., fifty percent platinum and fifty percent polysilicon), while it reduces to zero as a function of distance from the center.

Materials other than platinum may be used to produce the silicide bond. For example, tungsten or titanium may be used. Use of such noted materials, however, typically requires higher temperatures to form their respective silicide bonds than those required of platinum. Accordingly, use of tungsten or titanium with embodiments that have circuitry 30 on the intermediate apparatus (e.g., see FIGS. 4–6, discussed below) may not be recommended because such high temperatures may adversely affect the circuitry 30. In other words, the material selected to form the silicide bond should interdiffuse (and/or melt) at a temperature that is lower than temperatures that can adversely impact the circuitry 30 or other temperature sensitive portions of the MEMS device 10.

Other types of bonds can be used. For example, rather than form a silicide bond, a solder-based bond can be used. Use of this type of bond, however, requires additional process steps. In particular, in addition to metalizing at least the cap rim 22 (as discussed above), the MEMS rim 36 also is metalized. Continuing with the above example, in a manner similar to the cap rim 22, the MEMS rim 36 also may be sputter deposited with platinum or other solderable material. Solder then can be applied and cured at relatively low temperatures.

As noted above, the conductive rim 28 illustratively completely encircles the MEMS structure 24 to provide both a hermetic seal and a conductive path between the cap 18 and circuitry 30. In some embodiments, the conductive rim 28 forms a circular ring around the structure 24. In other embodiments, the conductive rim 28 forms some other shape (e.g., oval, rectangular, or an irregular shape) around the MEMS structure 24.

After the silicide bond is formed, the process continues to step 310, in which the bottom portion of the MEMS die 12 (or wafer, as the case may be) is subjected to a thinning process (e.g., backgrinding or etch back processes) that exposes the vias 32. Conductive contacts 34 then can be mounted to the bottom of the vias 32 (step 312), which then can be mounted to corresponding contacts on the top surface of the circuit die 14 (step 314). The wafers then can be diced, thus completing the process. As noted above, after it is fully formed, the resulting MEMS device 10 may be mounted in a package, flip chip mounted on a circuit board (after contacts are formed on one side), or used in any conventional manner.

Accordingly, as shown in FIG. 2 and discussed above, the cap 18 is electrically connected to the circuit die 14 through the conductive rim 28, corresponding vias 32, and ball contact 34 on the bottom of the MEMS substrate 26. Circuitry 30 on the circuit die 14 can set the potential of the cap 18 to ground or any desired voltage level. Alternatively, the conductive path through the MEMS die 12 to the conductive rim 28 can terminate at an external pin that can be externally grounded or set to any desired potential, such as 0.2 volts.

Figure 4:
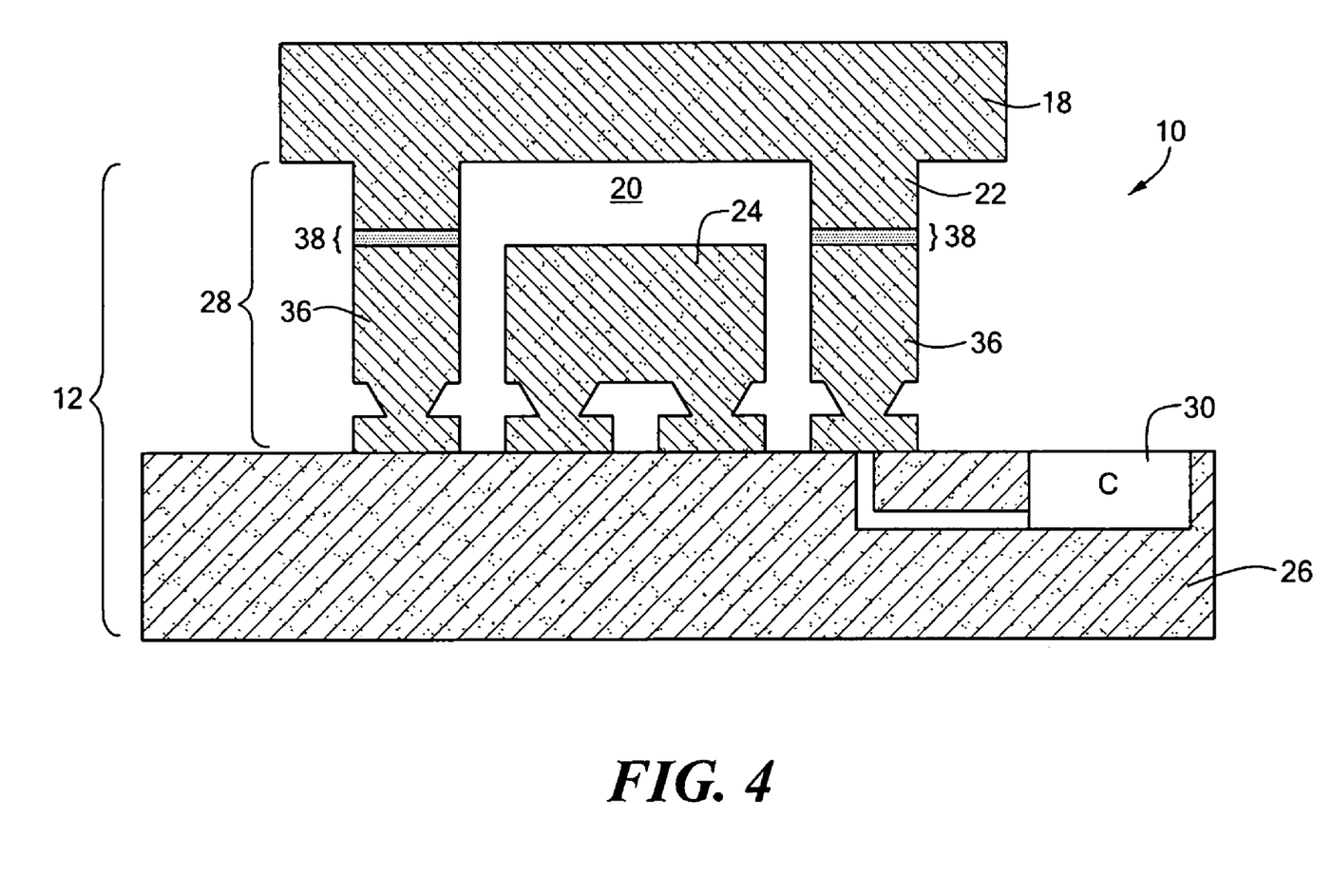
FIG. 4 schematically shows a cross-sectional view of an alternative embodiment of the invention implemented on MEMS device having circuitry and structure on the same die.

FIG. 4 shows an alternative embodiment of the MEMS device 10. Rather than have a separate circuit die 14, the MEMS die 12 may include both structure 24 and circuitry 30. In a manner similar to the MEMS die 12 shown in FIG. 2, the MEMS die 12 of this embodiment may be produced in a conventional manner, such as by using surface micromachining or SOI processes.

Figure 5:
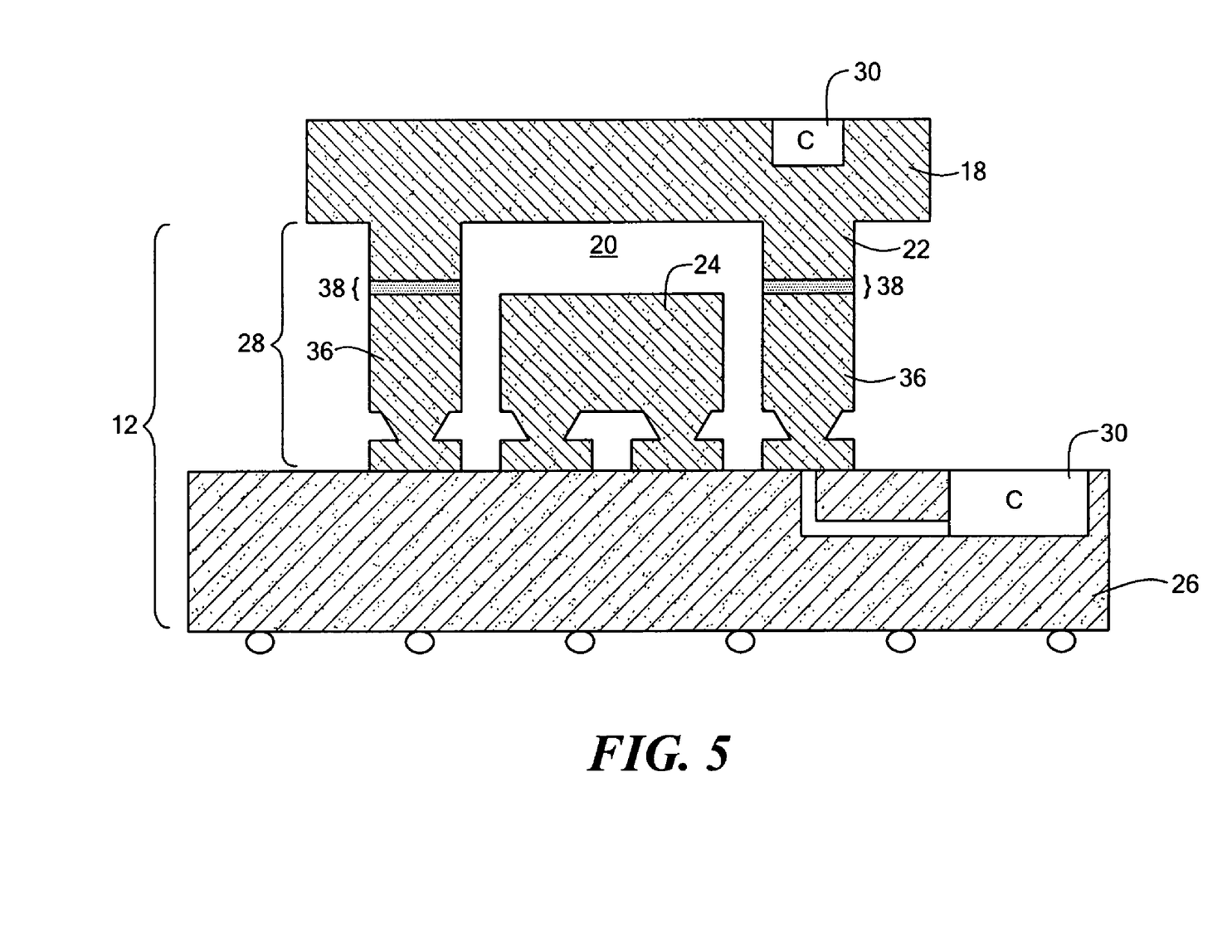
FIG. 5 schematically shows a cross-sectional view of another alternative embodiment of the invention implemented on MEMS device having circuitry and structure on the same die and circuitry on the cap.
Figure 6:
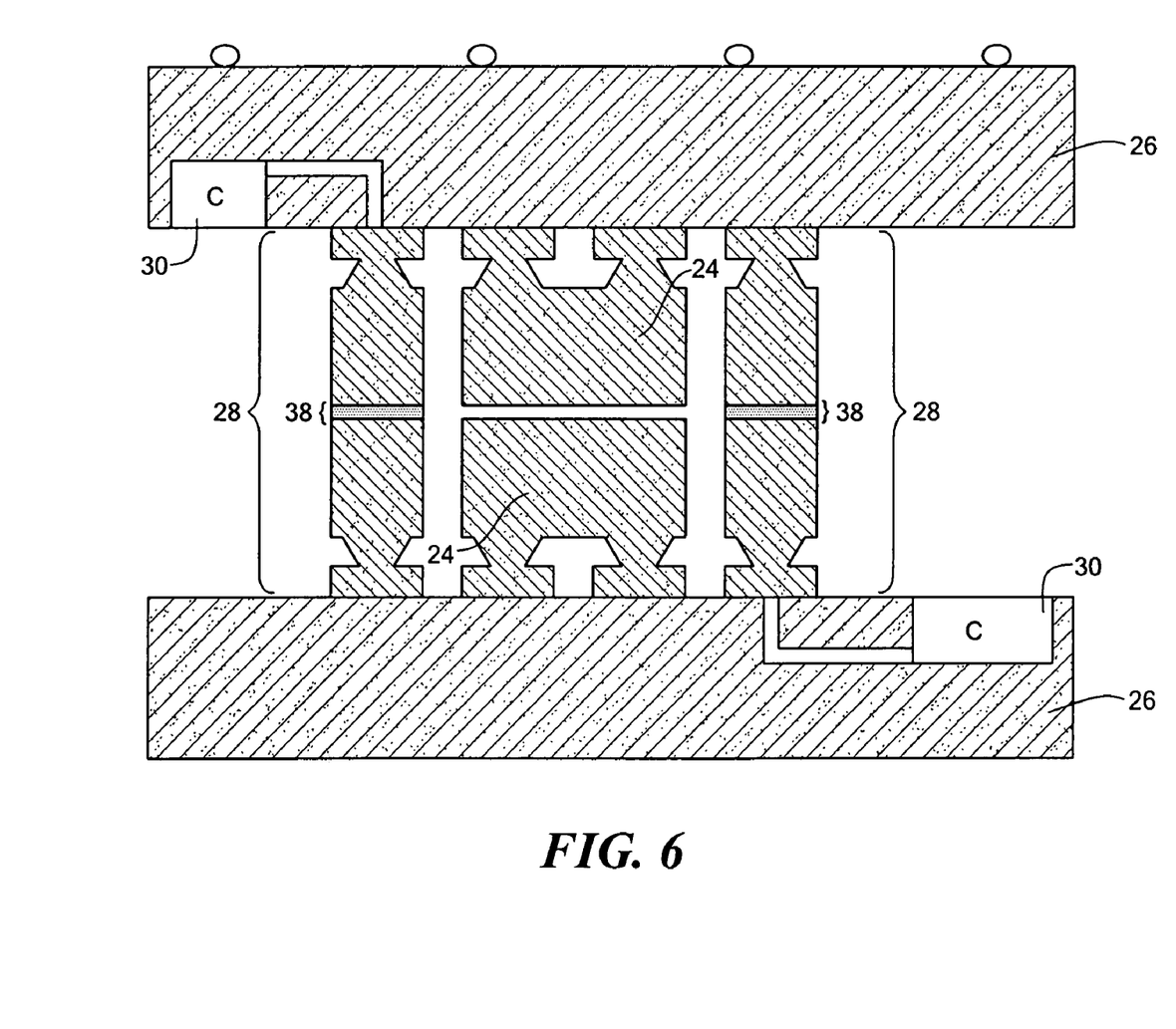
FIG. 6 schematically shows a cross-sectional view of yet another alternative embodiment of the invention implemented on a MEMS device in which the cap effectively forms another MEMS device.

FIG. 5 shows another embodiment in which a "smart cap" is used. In particular, the cap 18 may have circuitry 30 that shares or compliments processing with the circuitry 30 in the MEMS die 12. Instead of, or in addition to, bias potentials, the conductive path between the cap 18 and MEMS die 12 also can transmit data messages. FIG. 6 shows yet another embodiment in which two MEMS die 12 are mounted together. It should be noted that components of various of the embodiments shown in FIGS. 1–6 can be combined to form other embodiments. For example, instead of MEMS die 12 with integrated circuitry 30, the circuitry 30 in FIG. 6 may be located on one or more separate circuit die 14 as in FIG. 2.

Generally speaking, various embodiments of the invention have a conductive rim 28 that couples two wafers together in a manner that seals an internal area (e.g., having sensitive structure 24) on at least one of the wafers. In addition to (or instead of) other conductive paths, that conductive rim 28 also can be used to electrically communicate at least one of the wafers with some other wafer. Accordingly, unintended potential differences between the cap 18 and MEMS structure 24 should be avoided.

Different materials than those discussed above also may be used. Moreover, some embodiments are applicable to devices other than MEMS devices. For example, integrated circuits and other types of devices may implement aspects of the invention. Accordingly, discussion of MEMS devices is exemplary and thus, not intended to limit all embodiments of the invention.

Although the above discussion discloses various exemplary embodiments of the invention, it should be apparent that those skilled in the art can make various modifications that will achieve some of the advantages of the invention without departing from the true scope of the invention.

What is claimed is:

1. An apparatus comprising:
   a first wafer;
   a second wafer; and
   a conductive rim between the first and second wafers, the conductive rim electrically and mechanically connecting the first and second wafers, the conductive rim and second wafer at least in part sealing an area on the surface of the first wafer,
   wherein the conductive rim and second wafer hermetically seal the area on the surface of the first wafer.

2. The apparatus as defined by claim 1 wherein the conductive rim comprises a silicide.

3. The apparatus as defined by claim 1 wherein the area on the first wafer includes MEMS structure.

4. The apparatus as defined by claim 3 wherein the conductive rim is electrically isolated from the MEMS structure.

5. The apparatus as defined by claim 3 wherein the second wafer includes a cap.

6. The apparatus as defined by claim 1 wherein the first wafer includes circuitry capable of delivering a bias voltage to the second wafer via the conductive rim.

7. The apparatus as defined by claim 6 wherein the circuitry has a maximum temperature to which it can be exposed, the conductive rim being produced from a material that interdiffuses or melts at a temperature that is less than the maximum temperature to which the circuitry can be exposed.

8. The apparatus as defined by claim 1 wherein at least one of the first wafer and the second wafer comprises a silicon based material.

9. The apparatus as defined by claim 1 wherein at least one of the first wafer and the second wafer is comprised of polysilicon, single crystal silicon, or silicon germanium.

10. A MEMS device comprising:
   a first wafer;
   a second wafer; and
   conductive and sealing means between the first and second wafers, the conductive and sealing means electrically and mechanically connecting the first and second wafers, the second wafer and the conductive and sealing means at least in part sealing an area on the surface of the first wafer
   wherein the area on the first wafer includes a MEMS structure.

11. The MEMS device as defined by claim 10 wherein the conductive and sealing means includes a silicide bond between the first and second wafers.

12. The MEMS device as defined by claim 10 further including means for applying a bias voltage to the second wafer through the conductive and sealing means, the applying means being on the first wafer.

13. An apparatus comprising:
   a first wafer;
   a second wafer; and
   a conductive rim between the first and second wafers, the conductive rim electrically and mechanically connecting the first and second wafers, the conductive rim and second wafer at least in part sealing an area on the surface of the first wafer,
   wherein the area on the first wafer includes MEMS structure.

14. The apparatus as defined by claim 13 wherein the conductive rim comprises a suicide.

15. The apparatus as defined by claim 13 wherein the conductive rim is electrically isolated from the MEMS structure.

16. The apparatus as defined by claim 13 wherein the second wafer includes a cap.

17. The apparatus as defined by claim 13 wherein the first wafer includes circuitry capable of delivering a bias voltage to the second wafer via the conductive rim.

18. The apparatus as defined by claim 17 wherein the circuitry has a maximum temperature to which it can be exposed, the conductive rim being produced from a material that interdiffuses or melts at a temperature that is less than the maximum temperature to which the circuitry can be exposed.

* * * * *